United States Patent
Lee et al.

(10) Patent No.: US 7,132,217 B2
(45) Date of Patent: Nov. 7, 2006

(54) ORGANIC ANTI-REFLECTIVE COATING COMPOSITION AND PATTERN FORMING METHOD USING THE SAME

(75) Inventors: Geun Su Lee, Yongin-si (KR); Sam Young Kim, Icheon-si (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/891,568

(22) Filed: Jul. 15, 2004

(65) Prior Publication Data
US 2005/0014094 A1 Jan. 20, 2005

(30) Foreign Application Priority Data
Jul. 16, 2003 (KR) ........................ 10-2003-0048842

(51) Int. Cl.
G03C 1/825 (2006.01)
G03F 7/20 (2006.01)
G03F 7/30 (2006.01)

(52) U.S. Cl. ............................. 430/270.1; 430/273.1; 430/950; 430/961; 430/325; 430/326; 430/311; 430/330; 430/331; 430/319; 430/905

(58) Field of Classification Search ............ 430/270.1, 430/325, 326, 330, 331, 311, 319, 273.1
See application file for complete search history.

(56) References Cited

U.S. PATENT DOCUMENTS

| | | | |
|---|---|---|---|
| 4,774,161 A * | 9/1988 | Sekiya et al. ............... 430/175 |
| 5,879,853 A | 3/1999 | Azuma | |
| 5,994,430 A * | 11/1999 | Ding et al. .................... 524/80 |
| 6,057,080 A | 5/2000 | Brunsvold et al. | |
| 6,274,295 B1 | 8/2001 | Dammel et al. | |
| 6,783,919 B1 * | 8/2004 | Park et al. .................. 430/318 |
| 2003/0219682 A1 | 11/2003 | Wakiya et al. | |
| 2005/0175552 A1 * | 8/2005 | Hoic et al. ..................... 424/49 |

FOREIGN PATENT DOCUMENTS

GB    2 325 885 A   * 12/1998

* cited by examiner

Primary Examiner—Sin Lee
(74) Attorney, Agent, or Firm—Marshall, Gerstein & Borun LLP

(57) ABSTRACT

Disclosed are an organic anti-reflective coating composition which is introduced to top portion of a photoresist and a pattern forming method using the same, in a process for forming ultra-fine patterns of photoresist for photolithography by using 193 nm ArF or 157 nm VUV light source, and more particularly to, an organic anti-reflective coating composition which can protect photoresist from atmospheric amine to minimize a post exposure delay effect, and minimize pattern distortion caused by diffused reflection, i.e., a swing phenomenon, with the improvement of a notching phenomenon and the reduction of reflection rate, and a patterning forming method using the same.

21 Claims, 3 Drawing Sheets

ORGANIC ANTI-REFLECTIVE COATING COMPOSITION AND PATTERN FORMING METHOD USING THE SAME

BACKGROUND

1. Technical Field

An organic anti-reflective coating composition is disclosed which is introduced to the top portion of a photoresist and a pattern forming method using the same is disclosed, in a process for forming ultra-fine patterns of photoresist for photolithography by using 193 nm ArF or 157 nm VUV light source. More particularly, an organic anti-reflective coating composition is disclosed which can protect a photoresist by atomspheric amines to minimize the post exposure delay effect, and minimize pattern distortion caused by diffused reflection, i.e., a swing phenomenon, with the improvement of a notching phenomenon and the reduction of the reflection rate, and a patterning forming method using the same.

2. Description of the Related Art

In a fabrication process of ultrafine patterns for preparing semiconductor devices, standing waves and reflective notching inevitably occur due to the optical properties of lower film layer on the photoresist film and due to the thickness changes in the photosensitive film. In addition, there is another problem in that a CD (critical dimension) alteration is caused by diffracted and reflected light from the lower film layers. Thus, it has been suggested to introduce anti-reflective coating that prevents back reflection at a lower film layer between a lower film and a photoresist by introducing organic material with high absorbance at a wavelength range of the light employed as a light source. Especially, when exposed to UV light from the light source, a thin photoresist film is transmitted by the UV light, thus allowing the light absorbed in bottom portion of the thin film to be scattered and/or reflected. Such anti-reflective coating can absorb the scattered and/or reflected light and, thereby, directly affecting the fine processing of the photoresist.

However, as the patterns are becoming extremely ultrafine along with the reduction of semiconductor devices to less than 90 nm, it is difficult to completely prevent pattern alteration or distortion generated due to diffused reflection only by the above anti-reflective coating, that is, a bottom anti-reflective coating (hereinafter referred to as BARC) introduced between the bottom film layer and the photoresist. Therefore, it requires an improved anti-reflective coating material to be applied on top portion of the photoresist or a method for forming the pattern due to the above problem, which can greatly reduce and/or minimize the pattern distortion caused by the diffused reflection.

In processes for forming ultrafine patterns by using a light source with a wavelength of 157 nm, mostly used is a compound containing fluorine as a photosensitive agent. Such fluorine based photosensitive compound has a problem that it is contaminated by amine compounds among the atmosphere, since carbon-fluorine bond in the photosensitive compound may form a strong hydrogen bond with the nitrogen-hydrogen bond in the amine compound.

In particular, during the patterning process, a time delay effect for further process after exposure, a so-called post exposure delay effect, occurs and enlarges the contamination problem concerning the fluorine based photosensitive compound by atmospheric amine compounds such as ammonia. Therefore, a strong demand recently exists for novel anti-reflective coating material to be introduced onto the top portion of the photoresist or patterning process to minimize the contamination of photoresist film due to the post exposure delay.

Accordingly, due to such problems in the conventional art, there is a continuous demand for a novel additional anti-reflective coating material which can minimize contamination of the photoresist film caused by atmospheric amine compounds even when it generates a post exposure delay while having no adverse effect on the formation of patterns by exposure and development processes, in addition to, which can further reduce alteration or distortion of the pattern caused by the diffused reflection as the anti-reflective coating material is applied together with the conventional anti-reflective coating typically introduced on bottom portion of the photoresist, and a method for forming a pattern by employing such an anti-reflective coating material.

SUMMARY OF THE DISCLOSURE

An organic anti-reflective coating composition is disclosed which is introduced on a top portion of a photoresist, in a process for forming ultra-fine patterns of a photoresist for photolithography, which can protect the photoresist from amine compounds while having no adverse effect on the patterning process to minimize a post exposure delay effect, and minimize pattern distortion caused by diffused reflection.

In another aspect, a patterning method is disclosed using the organic anti-reflective coating composition mentioned above, and a semiconductor device produced by the same.

To achieve the above objects, one disclosed organic anti-reflective coating composition comprises a polymer represented by the following general formula I; and any one selected from a group consisting of a polymer represented by the following general formula II, a polymer represented by the following general formula III and a mixture thereof.

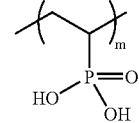

Formula I

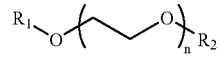

Formula II

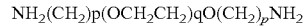

NH$_2$(CH$_2$)p(OCH$_2$CH$_2$)qO(CH$_2$)$_p$NH$_2$  Formula III

Wherein in above formulas, each of m and n is an integer ranging from 5 to 5,000; each of p and q is an integer ranging from 1 to 100; and R1 and R2 may be same or different each other, and represent H, alkyl group or fluoroalkyl group having C1–C10.

The disclosed top anti-reflective coating composition comprises the polymer represented by the formula I as a principle component and, further the polymer represented by the formula II or II. Since all of the polymers represented by the formulae I, II and III have a higher solubility in water and hydrophilic functional groups in molecules to be immiscible with a photosensitive agent, and have a higher solubility in a developing solution to be easily dissolved in the developing solution during a development process. Also, the anti-reflective coating composition of the present invention has a lower absorbance with respect to a light source having a wavelength of 193 nm or 157 nm and can transmit most light for forming the pattern during the exposure process for the photoresist, thereby being preferably used in formation of an anti-reflective coating film on top portion of the photoresist.

The polymer of the formula I has been disclosed in Korean Patent Application No. 2003-48520 filed by the applicant, which contains phosphoric acid inside and can neutralize the amine. Therefore, the above polymer can minimize the effect of the post exposure delay and, simultaneously, have an optimum refractive index effective to minimize the diffused reflection from the bottom film layer. As a result, when the polymer of the formula I is employed together with the conventional anti-reflective coating, it can significantly reduce distortion of pattern generated by the diffused reflection.

The disclosed organic top anti-reflective coating composition comprises such polymers listed above as major components and, further contains hydroxyl groups effective to form cross-linkage bonds within the anti-reflective coating film. Accordingly, the present composition includes the polymer with formula II or III to improve formation of the anti-reflective coating, thereby allowing formation of a favorable anti-reflective coating on top portion of the photoresist which can solve all of problems such as diffused reflection phenomenon and/or post exposure delay effect without any obstacle to the patterning process or the like.

As mentioned above, each of the polymers contained in the disclosed top anti-reflective coating composition has a weight average molecular weight of 1,000 to 1,000,000, preferably 2,000 to 10,000. Such a range of molecular weight is defined in consideration of physical properties such as the solubility of the anti-reflective coating in water or other developing solutions and/or the absorbance thereof. If such a molecular weight is excessively high, the solubility of the polymer in water may decrease, thereby cause difficulty in producing the anti-reflective coating composition and the coating itself or in dissolving the polymer in the developing solution due to the reduced solubility of the polymer in the developing solution resulting difficulty with the patterning process and further processes. When the molecular weight excessively decreases, it may cause a problem in that the anti-reflective coating is not successfully formed due to poor production of cross-linkage bonds within the anti-reflective coating.

Among such polymers included in the disclosed composition, poly (vinylphosphonic acid) polymer having a structure represented by the above formula I has been disclosed in the Korean Patent Application No. 2003-48520 of the present inventors as described above and is generally prepared by dissolving a vinylphosphonic acid having a structure represented by the following formula IV in an organic solvent, adding a polymerization initiator to the dissolved material, then, conducting free-radical polymerization under a vacuum condition, at 60 to 70° C. for 2 to 6 hours.

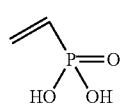

Formula IV

In the method for producing the above polymer, a molecular weight of the finally produced polymer can be varied dependent on the amount of the organic solvent and the reaction time and, the above polymer with the molecular weight suitable to be applied as the anti-reflective coating polymer can be produced by continuously conducting the reaction for about 2 to 6 hours.

The organic solvent used for polymerization includes any solvents useable in free-radical polymerization. Especially, preferably used is at least one selected from a group consisting of tetrahydrofuran, cyclohexanone, dimethyl formamide, dimethyl sulfoxide, dioxane, methylethylketone, PGMEA, ethylacetate, benzene, toluene and xylene. The polymerization initiator used in the present invention includes all conventional radical initiators for the free-radical polymerization and, preferably, one selected from a group consisting of 2,2'-azobisisobutyronitrile (AIBN), benzoyl peroxide, acetyl peroxide, lauryl peroxide, t-butyl peracetate, t-butyl hydroperoxide and di-t-butyl peroxide.

The polymers of the formulae II and III contained in the composition other than the polymer of the formula I, are generally known polymer materials which are produced by any conventional method or obtained commercially in the market.

In the organic anti-reflective coating composition, amount of the polymer represented by the formula I may be in the range of 1 to 70% by weight with respect to total amount of the composition and, preferably, in the range of 1 to 20% by weight. Likewise, amount of the polymer represented by the formula II or III is in the range of 1 to 30% by weight and, preferably, in the range of 1 to 20% by weight.

Since the coating composition is typically supplied in the form of an aqueous solution, it can be prepared by mixing each of the polymers having the amount defined above and the balance of water, dissolving the polymers in the water and, then, filtering the dissolved solution through a filter having 0.2 μm pore size to produce the final composition as above.

Additionally, in case of introducing the anti-reflective coating on the top portion of the photoresist by using the disclosed coating composition, this may cause a slight slope or top-loss on top portion of a profile of the pattern along practical process conditions. Optionally, this problem can be solved by adding an amine compound to the coating composition of the present invention. Such an amine compound generally includes both aliphatic alkylamines and aliphatic alkylammonium salts.

A disclosed method for forming pattern on a semiconductor device comprises: (a) coating a photoresist film on a semiconductor substrate formed with a desired bottom structure; (b) applying an organic anti-reflective coating composition on top portion of the photoresist film; and (c) exposing and developing the photoresist film to produce the desired photoresist pattern.

According to the above patterning process, it is possible to prevent contamination of the photoresist caused by a post exposure delay and the distortion of a pattern generated by diffused reflection by coating photoresist and then forming an anti-reflective coating on top portion thereof using the organic anti-reflective coating composition of the present invention. Such an anti-reflective coating has a higher solubility and is sufficiently dissolved in the developing solution, thereby having no adverse effect on the patterning process.

With respect to the patterning process of the present invention, the process may further include an additional baking process before or after the exposure process, which is preferably conducted at 70 to 200° C.

Although the above anti-reflective coating composition and the patterning process are mostly adapted to ultrafine pattern formation processes using ArF light source with 193 nm or VUV light source with 157 nm, they can be also applied to other ultrafine pattern formation processes using KrF (248 nm), EUV (13 nm), E-beam, X-ray or ionic beam. The exposure process using such light sources is preferably performed with specified exposing energy in the range of 0.1 to 50 mJ/cm$^2$.

In the disclosed patterning process, the development process can be carried out by employing an alkali developing solution. As such alkali developing solution, preferably provided is 0.01 to 5% by weight tetramethyl ammonium hydroxide (abbreviated to TMAH) in water.

A semiconductor device can be produced using the disclosed patterning process.

BRIEF DESCRIPTION OF THE DRAWINGS

Other aspects of this disclosure will become apparent from the following description of examples with reference to the accompanying drawings where.

DESCRIPTION OF THE PREFERRED EMBODIMENT

EXAMPLES

The disclosed coatings will now be described in a further detail with reference to the following examples, which are only illustrative and are not intended to limit the scope of this disclosure.

Example 1

Preparation of Organic Anti-reflective Coating Composition 7 g of poly (vinylphosphonic acid) polymer represented by the above formula I and having an average molecular weight of 4500 and 15 g of poly (ethyleneglycol) butylether polymer having an average molecular weight of 2000 were dissolved together in 880 ml of deionized water. The obtained solution was filtered through a filter having 0.2 μm pore size to produce the desired organic anti-reflective coating composition.

Example 2

Preparation of Organic Anti-reflective Coating Composition 7 g of poly (vinylphosphonic acid) polymer represented by the above formula I and having an average molecular weight of 4500 and 15 g of poly (ethyleneglycol) polymer having a weight average molecular weight of 2000 were dissolved together in 880 ml of deionized water. The solution obtained was filtered through a filter having 0.2 μm pore size to produce the desired organic anti-reflective coating composition.

Example 3

Preparation of Organic Anti-reflective Coating Composition 7 g of poly (vinylphosphonic acid) polymer represented by the above formula I and having an average molecular weight of 4500, 10 g of poly (ethyleneglycol) polymer having an average molecular weight of 2000, and 5 g of poly (ethyleneglycol) bis (3-aminopropyl) terminated polymer having an average molecular weight of 2000 were dissolved together in 880 ml of deionized water. The solution obtained was filtered through a filter having 0.2 μm pore size to produce the desired organic anti-reflective coating composition.

Example 4

Formation of Photoresist Pattern

On a silicone wafer previously treated with hexamethyl disilazane (HMDS), formed was a film to be etched. To top portion of the film, AX 1120 P (manufactured by Clariant Co.) as one of methacrylate type photosensitive agents was spin-coated to prepare a photoresist thin film having a thickness of 2,000 Å. Then, the obtained photoresist thin film was put under a soft baking process in an oven at 130° C. for 90 seconds. Thereafter, by spin-coating the top organic anti-reflective coating composition prepared in Example 1 at 3,000 rpm, the anti-reflective coating, that is, the top ARC having a thickness of 200 Å was coated on top portion of the photoresist. After conducting the soft-baking process, an exposure process was carried out by an exposure apparatus having 0.63NA ArF laser and then a further post-baking process was carried out in the oven at 130° C. for 90 seconds. After completion of the baking process, the baked product was immersed in an aqueous solution of 2.38% by weight of tetramethyl ammonium hydroxide for 30 seconds to be developed. The developed material was washed by spraying deionized water and dried to obtain an ultra-fine photoresist pattern with 90 nm L/S.

Figure 1:
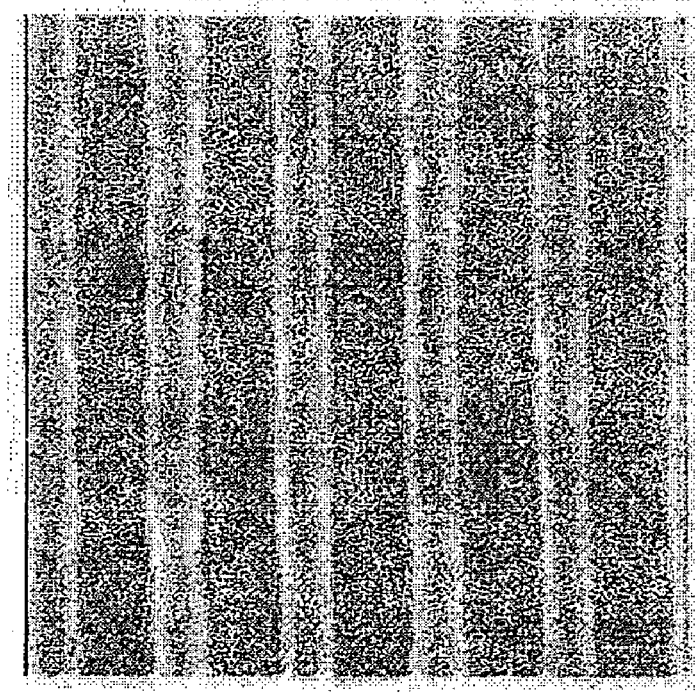
FIG. 1 is a scanning electron microscopic (SEM) photograph illustrating a pattern formed by introducing the anti-reflective coating composition prepared in Example 1 onto the top portion of a photoresist.

The photoresist pattern formed by the above method was illustrated in FIG. 1.

Example 5

Formation of Photoresist Pattern

The ultra-fine photoresist pattern with 90 nm L/S was obtained in the same manner as in Example 4, except that the composition prepared in Example 2 was used instead of the composition obtained in Example 1.

Figure 2:
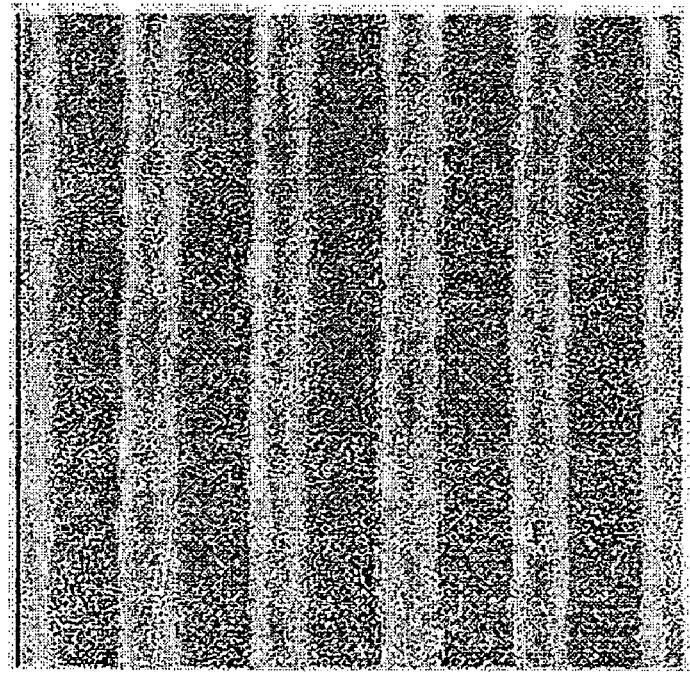
FIG. 2 is an electron microscopic photograph illustrating a pattern formed by introducing the anti-reflective coating composition prepared in Example 2 onto the top portion of the photoresist.

The photoresist pattern formed by the above method was illustrated in FIG. 2.

Example 6

Formation of Photoresist Pattern

The ultra-fine photoresist pattern with 90 nm L/S was obtained in the same manner as in Example 4, except that the composition prepared in Example 3 was used instead of the composition obtained in Example 1.

Figure 3:
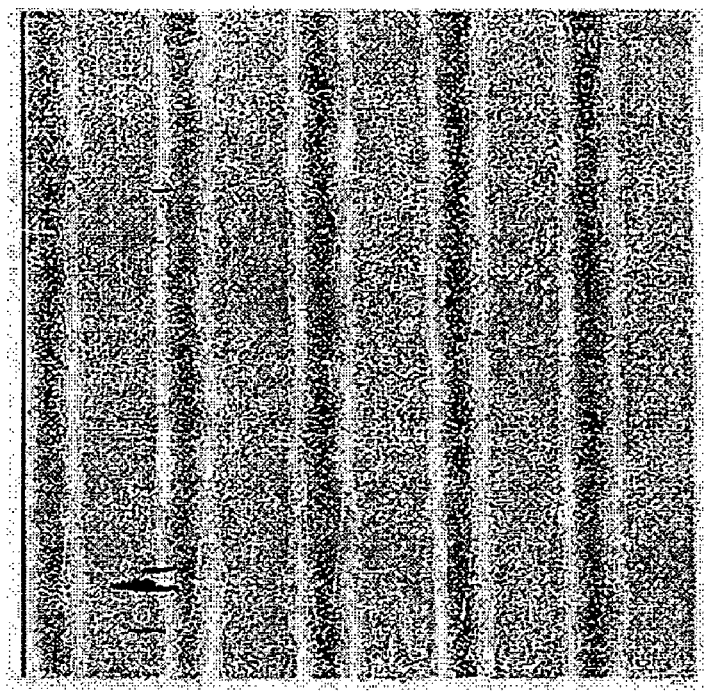
FIG. 3 is an electron microscopic photograph illustrating a pattern formed by introducing the anti-reflective coating composition prepared in Example 3 onto the top portion of the photoresist.

The photoresist pattern formed by the above method was illustrated in FIG. 3.

Comparative Example 1

Formation of Photoresist Pattern According to Conventional Art

Figure 4:
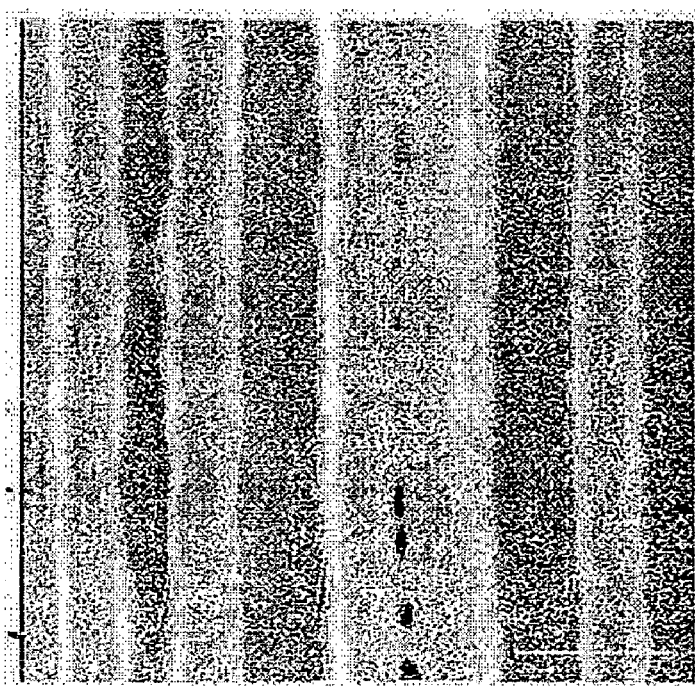
FIG. 4 is an electron microscopic photograph illustrating a pattern formed according to the conventional art described in Comparative Example 1, instead of introducing the anti-reflective coating composition prepared according to the present invention onto top portion of the photoresist.

The ultra-fine photoresist pattern with 90 nm L/S was obtained in the same manner as in Example 4, without the composition prepared by the present invention. The photoresist pattern formed by the above method was illustrated in FIG. 4.

As shown in the figures enclosed herein, in case of forming the ultra-fine pattern without using the anti-reflective coating composition according to the present invention, observed was pattern distortion caused by, for example, diffused reflection under a condition of 5 ppb amine density.

Example 7

Evaluation of the Effect by the Post Exposure Delay

Figure 5:
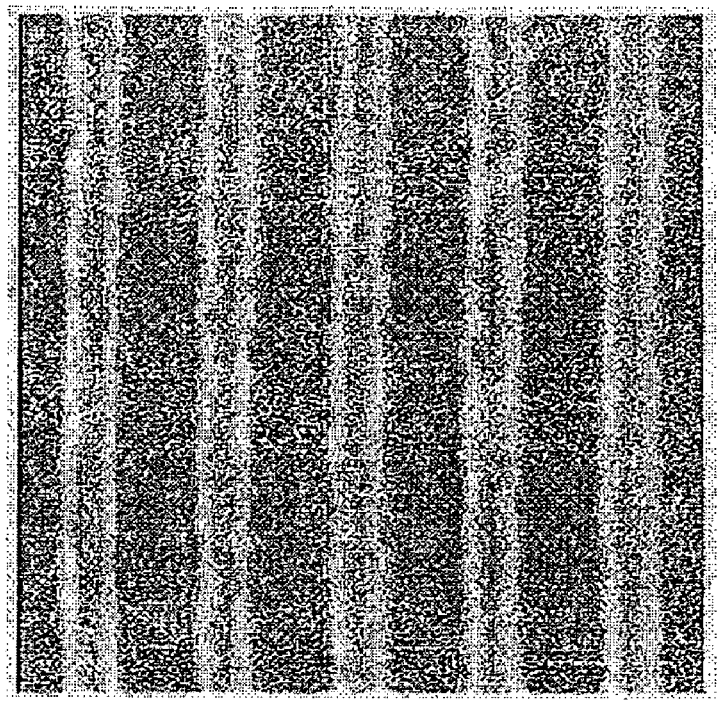
FIG. 5 is an electron microscopic photograph illustrating a pattern formed by introducing the anti-reflective coating composition prepared in Example 2 onto the top portion of the photoresist after 5 minutes after exposure.
Figure 6:
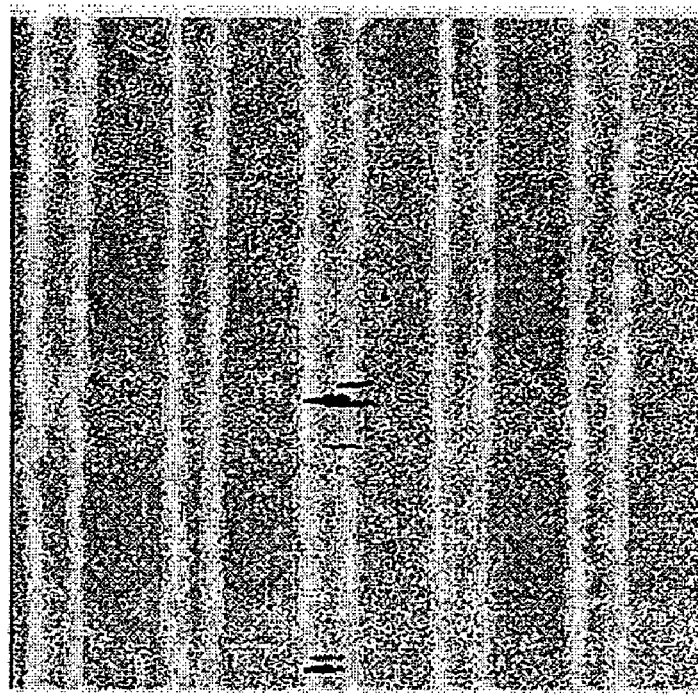
FIG. 6 is an electron microscopic photograph illustrating a pattern formed by introducing an anti-reflective coating composition prepared in Example 2 on top portion of the photoresist after 30 minutes after exposure.

With respect to the photoresist pattern formed by the procedure described in Example 5, the effect of the post exposure delay was determined by observing changes in the shape of the pattern depending on the time passed. The resultant pattern immediately after the exposure was shown in FIG. 2, while the patterns of 5 minutes and 30 minutes after the exposure were illustrated in FIGS. 5 and 6, respectively.

In addition to the above, CDs of such patterns were listed in Table 1.

TABLE 1

| Extended time | Immediately after exposure (FIG. 2) | 5 minutes after exposure (FIG. 5) | 30 minutes after exposure (FIG. 6) |
| --- | --- | --- | --- |
| CD | 89 nm | 87 nm | 90 nm |

As illustrated in the Table 1 and the accompanying Figures, variation of CD was within an allowable error range and the shape of the pattern was maintained even when the effect of the post exposure delay was generated. Accordingly, when using the organic anti-reflective coating composition to form ultra-fine patterns, the effect of the post exposure delay can be minimized.

As above mentioned, it is possible to minimize the effect of the post exposure delay and significantly reduce distortion phenomenon of the pattern caused by the diffused reflection while not causing any obstacle to the patterning process or further processes by introducing the organic anti-reflective coating on the top portion of the photoresist.

Especially, by applying the disclosed anti-reflective coating together with conventional anti-reflective coating introduced to the bottom portion of the photoresist, it is possible to minimize the diffused reflection, in turn, damage of the patterns, whereby the present invention can significantly contribute to the stability of a photolithography process at less than 90 nm.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A top organic anti-reflective coating composition comprising:
   a top organic anti-reflective polymer represented by the following general formula I; and
   any one selected from a group consisting of a polymer represented by the following general formula II, a polymer represented by the following general formula III and mixtures thereof:

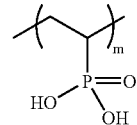

Formula I

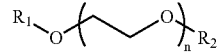

Formula II

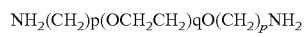

NH$_2$(CH$_2$)p(OCH$_2$CH$_2$)qO(CH$_2$)$_p$NH$_2$     Formula III wherein in the above formulas, each of m and n is an integer ranging from 5 to 5,000; each of p and q is an integer ranging from 1 to 100; R$_1$ and R$_2$ may be same or different from each other, and represent H, alkyl group or fluoroalkyl group having C$_1$–C$_{10}$; and all of the polymers represented by the above formula I, II and III have an average molecular weight ranging from 2,000 to 10,000.

2. The composition according to claim 1, wherein the polymer represented by the above formula I is contained in an amount of 1 to 20% by weight based on the total amount of the composition.

3. The composition according to claim 1, wherein the polymer represented by the above formula II or III is contained in an amount of 1 to 20% by weight based on the total amount of the composition.

4. The composition according to claim 1, wherein the composition further comprises an amine compound.

5. The composition according to claim 4, wherein the amine compound is aliphatic alkyl amines or aliphatic alkyl ammonium salts.

6. A method for forming pattern on a semiconductor device comprising the steps of:
   (a) coating a photoresist film on a semiconductor substrate formed with a desired bottom structure;
   (b) applying a top anti-reflective coating composition on the top portion of the photoresist film; and,
   (c) exposing and developing the exposed photoresist film to produce the desired photoresist pattern,
   wherein the top organic anti-reflective coating comprises an organic anti-reflective coating composition comprising a polymer represented by the following general formula I; and
   any one selected from a group consisting of a polymer represented by the
   following general formula II, a polymer represented by the following general formula III and a mixture thereof:

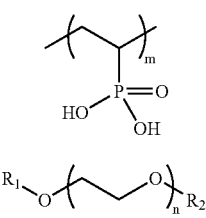

Formula I

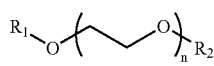

Formula II

NH$_2$(CH$_2$)p(OCH$_2$CH$_2$)qO(CH$_2$)$_p$NH$_2$   Formula III wherein in the above formulas, each of m and n is an integer ranging from 5 to 5,000; each of p and q is an integer ranging from 1 to 100; and R$_1$ and R$_2$ may be same or different from each other, and represent H, alkyl group or fluoroalkyl group having C$_1$–C$_{10}$.

7. The method according to claim 6, further comprising an additional baking process before or after the exposure.

8. The method according to claim 6, wherein the developing process is carried out by using an aqueous solution of 0.01 to 5% by weight tetramethyl ammonium hydroxide (TMAH) as a developing solution.

9. An organic anti-reflective coating composition comprising:
a polymer represented by the following general formula I; and
any one selected from a group consisting of a polymer represented by the following general formula II, a polymer represented by the following general formula III and mixtures thereof:

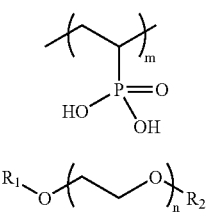

Formula I

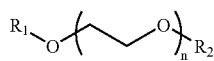

Formula II

NH$_2$(CH$_2$)p(OCH$_2$CH$_2$)qO(CH$_2$)$_p$NH$_2$   Formula III wherein in the above formulas, each of m and n is an integer ranging from 5 to 5,000; each of p and q is an integer ranging from 1 to 100; and R$_1$ and R$_2$ may be same or different from each other, and represent H, alkyl group or fluoroalkyl group having C$_1$–C$_{10}$; and
wherein all of the polymers represented by the above formula I, II and III have an average molecular weight ranging from 2,000 to 10,000.

10. The composition according to claim 9, wherein the polymer represented by the above formula I is contained in an amount of 1 to 20% by weight based on the total amount of the composition.

11. The composition according to claim 9, wherein the polymer represented by the above formula II or III is contained in an amount of 1 to 20% by weight based on the total amount of the composition.

12. The composition according to claim 9, wherein the composition further comprises an amine compound.

13. The composition according to claim 12, wherein the amine compound is aliphatic alkyl amines or aliphatic alkyl ammonium salts.

14. An organic anti-reflective coating composition consisting essentially of:
a polymer represented by the following general formula I; and
any one selected from the group consisting of a polymer represented by the following general formula II, a polymer represented by the following general formula III and mixtures thereof:

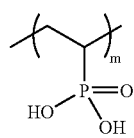

Formula I

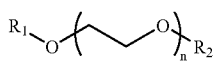

Formula II

NH$_2$(CH$_2$)p(OCH$_2$CH$_2$)qO(CH$_2$)$_p$NH$_2$   Formula III wherein in the above formulas, each of m and n is an integer ranging from 5 to 5,000; each of p and q is an integer ranging from 1 to 100; and R$_1$ and R$_2$ may be same or different from each other, and represent H, alkyl group or fluoroalkyl group having C$_1$–C$_{10}$.

15. The composition according to claim 14, wherein all of the polymers represented by the above formula I, II and III have an average molecular weight ranging from 2,000 to 10,000.

16. The composition according to claim 14, wherein the polymer represented by the above formula I is contained in an amount of 1 to 20% by weight based on the total amount of the composition.

17. The composition according to claim 14, wherein the polymer represented by the above formula II or III is contained in an amount of 1 to 20% by weight based on the total amount of the composition.

18. An organic anti-reflective coating composition consisting essentially of:
a polymer represented by the following general formula I; and
any one selected from a group consisting of a polymer represented by the following general formula II, a polymer represented by the following general formula III and mixtures thereof:

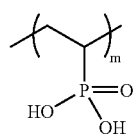

Formula I

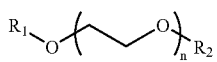

Formula II

NH$_2$(CH$_2$)p(OCH$_2$CH$_2$)qO(CH$_2$)$_p$NH$_2$   Formula III wherein in the above formulas, each of m and n is an integer ranging from 5 to 5,000; each of p and q is an integer ranging from 1 to 100; and R$_1$ and R$_2$ may be same or different from each other, and represent H, alkyl group or fluoroalkyl group having $C_1$–$C_{10}$; and an amine compound, wherein all of the polymers represented by the above formula I, II, and III have an average molecular weight ranging from 2,000 to 10,000.

19. The composition according to claim 18, wherein the polymer represented by the above formula I is contained in an amount of 1% to 20% by weight based on the total amount of the composition.

20. The composition according to claim 18, wherein the polymer represented by the above formula II or III is contained in an amount of 1% to 20% by weight based on the total amount of the composition.

21. The composition according to claim 18, wherein the amine compound is aliphatic alkyl amines or aliphatic alkyl ammonium salts.

* * * * *